(12) United States Patent
Gehle et al.

(10) Patent No.: US 8,222,700 B2
(45) Date of Patent: Jul. 17, 2012

(54) PROTECTION CIRCUIT AND OPERATING METHOD THEREOF

(75) Inventors: Marcus Gehle, Faak am See (AT); Uwe Weder, Au (DE)

(73) Assignee: Infineon Technologies AG (DE)

( * ) Notice: Subject to any disclaimer, the term of this patent is extended or adjusted under 35 U.S.C. 154(b) by 1057 days.

(21) Appl. No.: 11/620,524

(22) Filed: Jan. 5, 2007

(65) Prior Publication Data

US 2007/0171588 A1    Jul. 26, 2007

(30) Foreign Application Priority Data

Jan. 5, 2006  (DE) .......................... 10 2006 000 936

(51) Int. Cl.
  *H01L 21/70* (2006.01)
(52) U.S. Cl. .................. 257/368; 257/E27.06
(58) Field of Classification Search .............. 257/213, 257/288, 368–377, E27.001, E27.009, E27.01, 257/E27.046, E27.059, E27.06, E27.061, 257/E27.062, E27.063; 327/524, 530, 534–543
See application file for complete search history.

(56) References Cited

U.S. PATENT DOCUMENTS

| | | | | |
|---|---|---|---|---|
| 5,694,072 A | * | 12/1997 | Hsiao et al. | 327/537 |
| 6,124,752 A | * | 9/2000 | Kuroda | 327/534 |
| 2003/0020535 A1 | * | 1/2003 | Young et al. | 327/538 |

FOREIGN PATENT DOCUMENTS

| | | |
|---|---|---|
| DE | 38 06 951 | 3/1999 |
| DE | 199 39 245 | 4/2000 |
| DE | 101 01 995 | 7/2002 |
| DE | 101 96 994 9 | 11/2003 |
| DE | 10 2004 009 622 | 6/2005 |
| DE | 10 2004 015 546 | 10/2005 |
| EP | 1 128 248 | 8/2001 |

* cited by examiner

*Primary Examiner* — Ha Tran T Nguyen
*Assistant Examiner* — Kevin Quinto
(74) *Attorney, Agent, or Firm* — Dickstein Shapiro LLP

(57) ABSTRACT

A semiconductor component including a semiconductor substrate, a doped well formed in the semiconductor substrate, transistor structures arranged in the doped well, and an integrated circuit connected to the doped well, wherein the integrated circuit intermittently charges the doped well to a provided electrical potential, ascertains a deviation of the potential present at the doped well from the provided potential, and triggers an alarm signal in the event of a specific deviation.

20 Claims, 3 Drawing Sheets

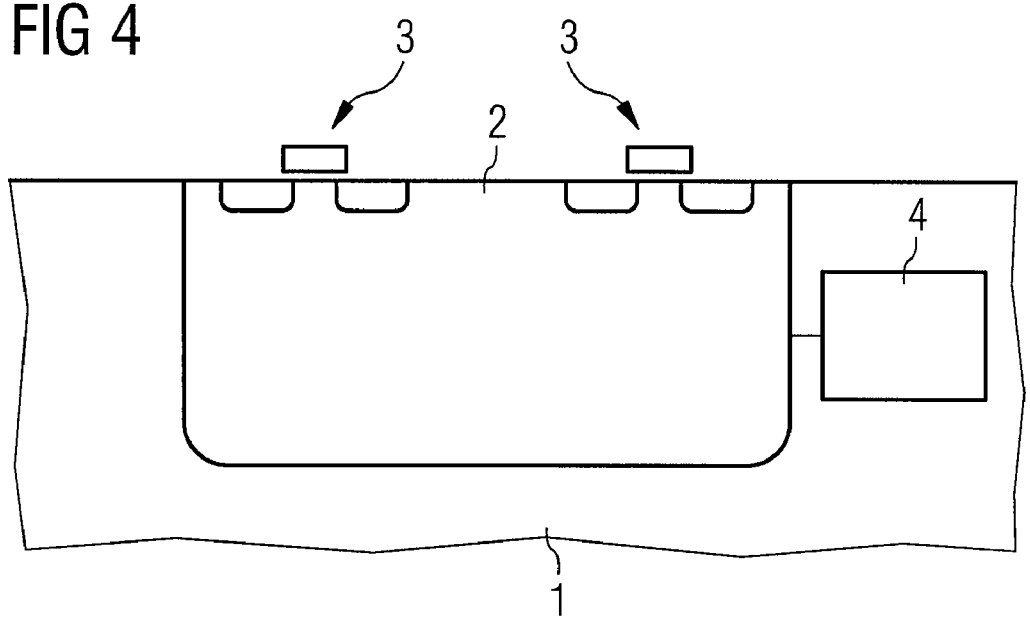

PROTECTION CIRCUIT AND OPERATING METHOD THEREOF

CROSS-REFERENCE TO RELATED APPLICATION

This application claims priority to German Patent Application Serial No. 102006000936.3, which was filed Jan. 5, 2006, and is incorporated herein by reference in its entirety.

FIELD OF THE INVENTION

The present invention relates to a protection of semiconductor components, in particular of logic components, against light attacks.

BACKGROUND OF THE INVENTION

In semiconductor components comprising a logic circuit such as is used as a central processing unit (CPU), for example, standard cells comprising p-channel transistors are arranged in a well doped in n-conducting fashion. These n-doped wells are fixedly connected to the highest electrical potential provided (supply voltage $V_{DD}$). What is achieved thereby is that the pn-junction between the well doped in n-conducting fashion and the source region becomes non-conducting. In addition, defined transistor properties are obtained. Moreover, this prevents the well potential from decreasing below a value at which a so-called latch-up of the component occurs, the latch-up having the effect that the component is no longer functional.

One problem in the case of semiconductor components is a required safeguarding against light attacks which can bring about functional disturbances of the component or are intended to enable an undesirable external analysis of the circuit construction. There are already a series of proposals as to how a semiconductor component can be protected against light attacks. However, the necessary measures are generally very complicated and therefore make the component considerably more expensive. Moreover, the additional area requirement of the components of a protection circuit easily exceeds the available area for the entire integrated circuit. The known measures relate without exception to global light attacks, that is to say light attacks that are not restricted to delimited regions. No efficient measures are known against local light attacks.

BRIEF DESCRIPTION OF THE DRAWINGS

Examples of the semiconductor component and of the protection circuit are described in more detail below with reference to the accompanying FIGS. 1 to 4.

FIG. 4 shows a cross-section through a semiconductor component provided with the protection circuit.

DETAILED DESCRIPTION OF THE INVENTION

The present invention enables semiconductor chips, in particular logic components, to be effectively and simply protected against light attacks.

A doped well of the semiconductor component is charged to a provided electrical potential at regular short intervals. The well remains at floating potential between the charging operations and is discharged in the case of a light attack, independently of the point at which the light impinges. A detector circuit is provided for detecting a decrease in the potential of the well and for triggering an alarm signal in the event of a provided limit value being reached. A periodic signal, preferably a pulsed signal, is provided for the charging of the well by means of a charging circuit, which signal alternately opens and closes a switch that connects the well to the provided electrical potential in short time intervals. The charging operation typically lasts a few nanoseconds, followed in each case by a state of floating potential lasting a few microseconds or milliseconds.

Between the charging operations, a light incidence has the effect that the potential of the well decreases. This decrease can be detected by the protection circuit, with the result that an alarm signal can be triggered and a latch-up of the semiconductor component can be prevented preferably by means of a special protection circuit. The latch-up protection circuit prevents a further decrease in the well potential. Provision may additionally be made for immediately charging the well again in order to bring the well to the provided potential again as quickly as possible. Potential fluctuations at the well which are caused by the fact that the well is not constantly connected to a connection of a supply voltage can be prevented by using a reference current source connected to the well.

This protection device achieves comprehensive protection against light attacks both from the front side and from the rear side (substrate) of the semiconductor component. No further measures are necessary within the circuits to be protected. The entire circuit integrated into the chip, in particular a complete logic circuit, can be protected. The sensitivity can be preset, or alternatively be adopted to the respective operating state of the component. This is done, in particular, by suitably choosing the time duration during which the well remains at floating potential. By way of the reference current, the sensitivity of the protection circuit can likewise be set in a suitable manner, and the latch-up protection circuit can be set in such a way as to prevent a decrease in the voltage at the doped well below a specific predetermined value. The protection circuit can therefore be adapted to the respective requirements within a wide scope.

Figure 1:
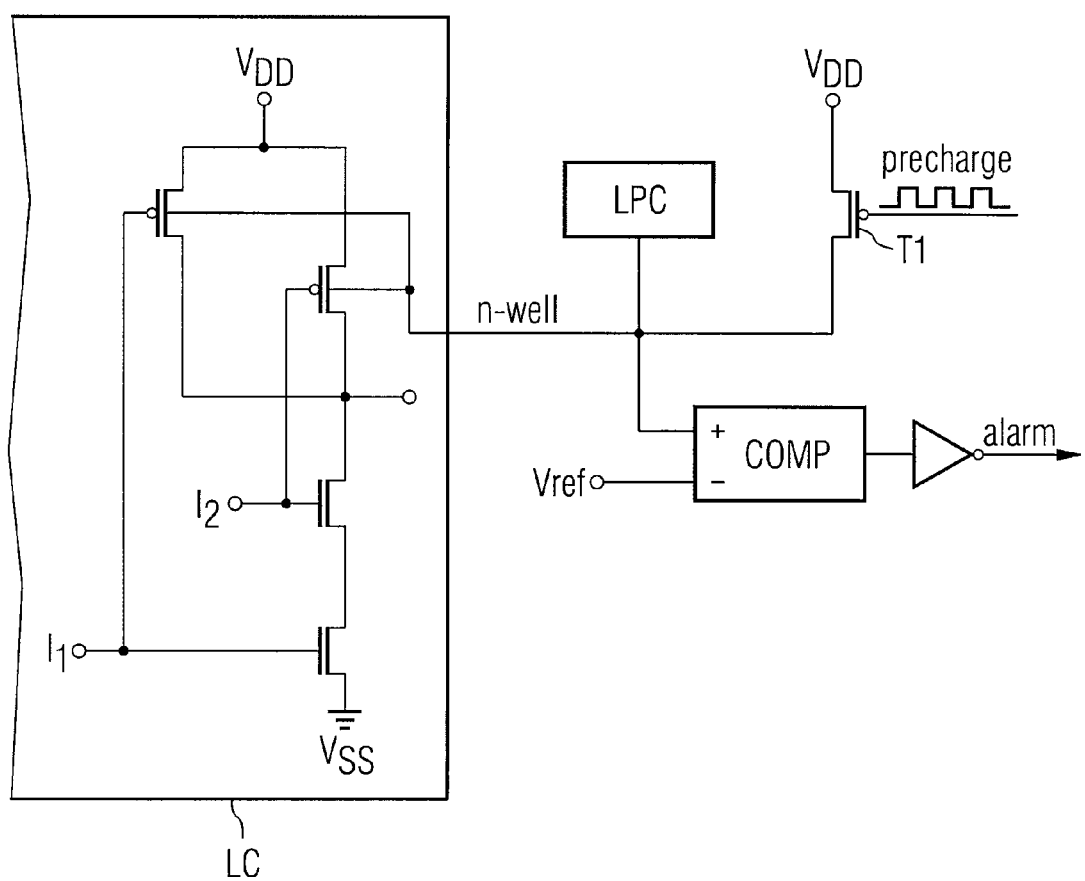
FIG. 1 shows a schematic circuit diagram of the protection circuit.

In the schematic circuit diagram of FIG. 1, an example of a logic circuit LC is depicted on the left-hand side. The logic circuit represents only one possible exemplary embodiment and is not essential to the protection circuit according to the invention. On the basis of the logic circuit, the intention is to show that, unlike what is otherwise customary, the connection of the doped well as is designated by "n-well" is not connected directly to the supply voltage $V_{DD}$ in the schematic circuit diagram of FIG. 1. The connection of the doped well is instead connected to a connection of the supply voltage $V_{DD}$ via the switch T1, which is preferably a transistor. Switch T1 is closed intermittently. A periodic signal is provided for this, which signal is symbolized as square-wave signal "precharge" in the example of FIG. 1. It is passed as control signal to the gate connection of the switch T1.

The doped well is charged periodically. The potential provided for this purpose need not be $V_{DD}$; the choice of the positive connection $V_{DD}$ of the supply voltage is particularly preferred, however, in the described example of a well doped in n-conducting fashion. The charging typically lasts approximately a few nanoseconds. In the interim, there is in each case a time period of the order of magnitude of microseconds or milliseconds in which the potential of the doped well is floating. In these intervening times, the potential present at the doped well is in each case compared with a reference voltage $V_{ref}$. A comparator COMP is provided for this in the schematic circuit diagram of the example of FIG. 1. If the potential present at the doped well deviates significantly from the provided potential, that is to say decreases significantly below the positive supply potential $V_{DD}$ in the example illustrated, an alarm signal is generated in the circuit.

In the case of a logic component, $V_{DD}$ is typically 1.5V. In this case, the threshold for generating an alarm signal will preferably be provided in the voltage range of approximately 1.3V to 1.2V. This is because if the potential present at the doped well has decreased to values that lie significantly below the voltage range, there is the risk of a latch-up of the component occurring. A latch-up protection circuit LPC is provided in the configuration of a protection circuit illustrated in FIG. 1. The protection circuit is designed, in principle, such that it prevents an excessively great decrease in the potential present at the doped well. For this purpose, it is connected in a suitable manner to a connection of the relevant potential, the supply voltage $V_{DD}$ in this example.

The concrete configuration of the latch-up protection circuit is arbitrary, in principle, if it just has the effect of reliably preventing the potential of the doped well from decreasing too far. The latch-up protection circuit may be designed, in particular, such that its effect is activated by the generated alarm signal.

Figure 2:
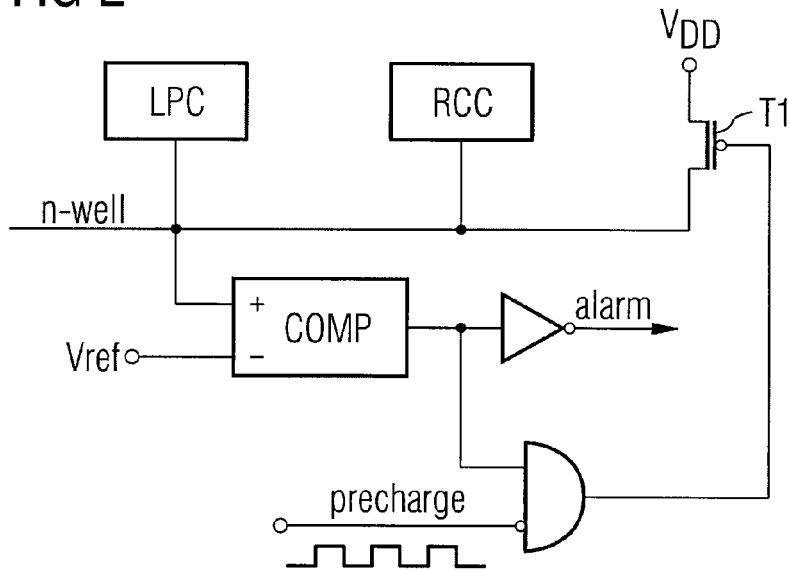
FIG. 2 shows a schematic circuit diagram for an alternative protection circuit.

FIG. 2 illustrates a schematic circuit diagram corresponding to the schematic circuit diagram of FIG. 1 which is supplemented by further components. In this circuit, the doped well is charged to the provided potential not only in the regular alternation of the periodic signal "precharge", but also when the comparator outputs an alarm signal. The alarm signal is, after all, the indication of the fact that the potential at the doped well has decreased to an excessively greater extent. In the case of the circuit illustrated in FIG. 2, apart from the alarm signal being generated, the switch T1 is caused to be closed and the well is thus caused to be connected to the provided potential $V_{DD}$. The periodic sequence of the charging cycles is thus interrupted in order that an advanced charging of the doped well can be effected out of turn. In this way, the occurrence of a latch-up is always reliably prevented in addition to the protection brought about by the latch-up protection circuit LPC.

A stabilization circuit in the form of a reference current circuit RCC is additionally provided in the schematic circuit diagram of FIG. 2. With this circuit, by means of a reference current source, voltage fluctuations of the doped well are absorbed and the potential at the doped well is thus stabilized. What is achieved thereby is that the protection mechanism goes into action only when the potential present at the doped well deviates considerably from a desired potential, for example on account of a light attack. In this way, momentary voltage fluctuations that can occur while the doped well is in the state of floating potential are prevented and cannot become apparent in a disadvantageous manner, in particular cannot lead to an undesirable triggering of an alarm. This stabilization circuit can be set in a suitable manner through the choice of the intensity of the reference current.

Figure 3:
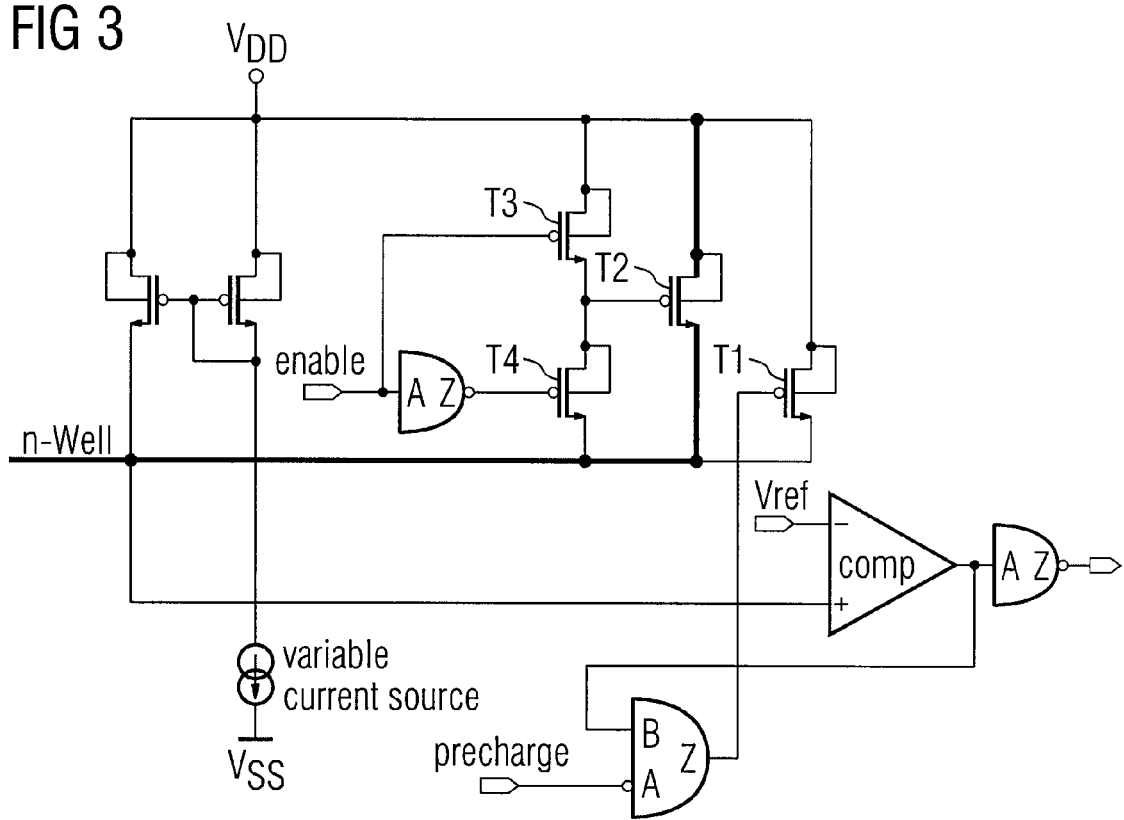
FIG. 3 shows an exemplary embodiment of the protection circuit in accordance with FIG. 2.

Further explanations follow on the basis of a concrete exemplary embodiment of these circuits. FIG. 3 illustrates a circuit as an exemplary embodiment with respect to the schematic circuit diagram of FIG. 2. The connection to the doped well, a well doped in n-conducting fashion in this example, is depicted on the left-hand side. A variable current source is connected between the potential $V_{DD}$ and $V_{SS}$ for the purpose of forming the reference current circuit RCC, the variable current source being connected to the connection of the doped well via a current mirror formed from two transistors. This circuit forms a high-impedance connection of the supply voltage to the doped well, which brings about a stabilization of the potential present at the well without the well being constantly connected to a supply voltage. The stabilization can additionally be set by means of the variable current source. This circuit section is preferably present, but it can also be omitted.

The latch-up protection circuit is illustrated further on the right in FIG. 3, the essential constituent part of the protection circuit being the transistor T2. The connection to the doped well is connected to the positive supply voltage $V_{DD}$ via the transistor T2. In the preferred exemplary embodiment illustrated, the latch-up protection circuit can be switched on and off by means of a signal (enable). In this embodiment, the gate connection of the transistor T2 is connected via the further switches T3 and T4, which are preferably transistors, to $V_{DD}$ and the connection of the doped well (n-well), respectively. The enable signal applied to the latch-up protection circuit has the effect that it is always the case that one of the further switches T3 or T4 is in the on state and the other is in the off state. Depending on which of the further switches T3 or T4 is turned on, the high potential $V_{DD}$ or respectively the potential of the doped well (n-well) is permanently present at the gate connection of the transistor T2.

If the first further switch T3 is in the on state and the second further switch T4 is in the off state, so that the potential $V_{DD}$ is consequently present at the gate connection of the transistor T2, the transistor T2 interrupts the connection between the doped well and the potential $V_{DD}$, and the doped well can be at floating potential in the meantime. If the second further switch T4 is in the on state and the first further switch T3 is in the off state, so that the well potential is consequently present at the gate connection of the transistor T2, the transistor T2 becomes more and more conducting in the event of a decrease in the well potential, which prevents the well potential from decreasing down to the voltage range that is critical for a latch-up. The transistor T2 is suitably dimensioned, in particular made sufficiently large, for this purpose.

The occurrence of a latch-up is thus prevented. In this example, the latch-up protection circuit is only illustrated in one of many possibilities. The circuit is at any rate designed such that the well potential is prevented from decreasing below a limit value provided. The latch-up protection circuit is preferably designed such that the protection circuit does not start to function when there are just slight voltage fluctuations that possibly occur relatively frequently during operation of the component, but rather starts to function only when there is a significant decrease in the voltage, in particular on account of a light attack.

The intermittent charging of the doped well via the first switch T1 is effected on the basis of a periodic signal "precharge" present at the connection A of the logic element. Present at the second input B is the output signal of the comparator COMP, which brings about the closing of the first switch T1 and charging of the doped well if the potential at the doped well decreases below the value of the reference voltage $V_{ref}$. Protection against a latch-up is thereby effected in addition to the latch-up protection circuit. This circuit makes it possible reliably to detect a light attack and at the same time to prevent a latch-up of the component.

FIG. 4 shows a cross-section through a basic construction of a semiconductor component comprising the protection circuit provided. A doped well 2, in particular an n-doped well, is formed in a substrate 1 made of semiconductor material, which may be provided with a p-conducting basic doping, for example. The transistor structures 3 of the logic circuit, here p-channel transistors, are arranged in the doped well 2. The protection circuit 4 is integrated in the semiconductor chip and connected to the doped well 2 in the manner described. This is indicated only schematically in the cross-section of FIG. 4. The protection circuit can be integrated together with the rest of the circuit sections and components in the semiconductor component in the manner known per se from IC chips.

What is claimed is:

1. A semiconductor component comprising:
a semiconductor substrate;
a doped well formed in the semiconductor substrate;
transistor structures arranged in the doped well; and
an integrated circuit connected to the doped well,
wherein the integrated circuit is configured to intermittently charge the doped well to a provided electrical potential at regular intervals, maintain the doped well at a floating potential between intermittent charging operations, ascertain between intermittent charging operations a deviation of the potential present at the doped well from the provided potential, and trigger an alarm signal in the event of a deviation below a predetermined value, thereby indicating a light attack.

2. The semiconductor component as claimed in claim 1, wherein the doped well is an n-doped well and the provided electrical potential is a positive supply voltage.

3. The semiconductor component as claimed in claim 1, wherein the integrated circuit comprises a switch connected between the well and the provided electrical potential, and the integrated circuit is configured to open and close the switch according to a periodic signal.

4. A protection circuit connected to a doped well in a semiconductor substrate of a semiconductor component, the protection circuit comprising:
a charging circuit, which is configured to connect the doped well intermittently to a provided electrical potential at regular intervals, and maintain the doped well at a floating potential between intermittent connections; and
a detector circuit, which is configured to ascertain between intermittent connections a deviation of the potential present at the doped well from the provided potential and trigger an alarm signal in the event of a deviation below a predetermined value, thereby indicating a light attack.

5. The protection circuit as claimed in claim 4, further comprising a switch connected between the doped well and the provided electrical potential.

6. The protection circuit as claimed in claim 4, wherein the well is an n-doped well.

7. The protection circuit as claimed in claim 4, wherein the provided electrical potential is a supply voltage of the protection circuit.

8. The protection circuit as claimed in claim 4, wherein the charging circuit is configured to generate a pulsed signal and the doped well is connected to the provided electrical potential for each duration of a pulse of a pulsed signal.

9. The protection circuit as claimed in claim 4, which is provided for protecting a logic component against light attacks.

10. The protection circuit as claimed in claim 4, wherein the detector circuit comprises a comparator and a reference voltage.

11. The protection circuit as claimed in claim 4, further comprising a latch-up protection circuit configured to prevent a latch-up state of the semiconductor component.

12. A protection circuit connected to a doped well in a semiconductor substrate of a semiconductor component, the protection circuit comprising:
a charging circuit, which is configured to connect the doped well intermittently to a provided electrical potential;
a detector circuit, which is configured to ascertain a deviation of the potential present at the doped well from the provided potential and trigger an alarm signal in the event of a specific deviation; and
a latch-up protection circuit which is configured to prevent a latch-up state of the semiconductor component, wherein
the latch-up protection circuit comprises a transistor having a gate connection and is connected between the doped well and the provided electrical potential,
the gate connection of the transistor is connected to the provided electrical potential via a first further switch and to the doped well via a second further switch, and
the first and the second further switches are addressed with a signal such that it is always the case that one of the further switches is in the on state and the other is in the off state.

13. A protection circuit connected to a doped well in a semiconductor substrate of a semiconductor component, the protection circuit comprising:
a charging circuit, which is configured to connect the doped well intermittently to a provided electrical potential, and maintain the doped well at a floating potential between intermittent connections;
a detector circuit, which is configured to ascertain between intermittent connections a deviation of the potential present at the doped well from the provided potential and trigger an alarm signal in the event of a deviation below a predetermined value, thereby indicating a light attack; and
a reference current circuit, which is connected to the doped well and is configured to stabilize the potential present at the connection to the doped well.

14. The protection circuit as claimed in claim 13, wherein the reference current circuit comprises a current mirror.

15. The protection circuit as claimed in claim 13, wherein the reference current circuit comprises a variable current source.

16. An operating method for a protection circuit affording protection against light attacks, the method comprising:
charging a doped well of a semiconductor component to a provided electrical potential at regular intervals;
maintaining the doped well at a floating potential between the charging operations;
ascertaining, between charging operations, a deviation of the potential present at the doped well from the provided potential; and
triggering an alarm signal in the event of a deviation below a predetermined value, thereby indicating a light attack.

17. The operating method as claimed in claim 16, wherein the doped well is an n-doped well, and the provided electrical potential is a positive supply voltage.

18. The operating method as claimed in claim 16, further comprising:
generating a pulsed signal; and
connecting the doped well to the provided electrical potential for the duration of each pulse of the pulsed signal.

19. The operating method as claimed in claim 16, wherein the integrated circuit is configured to intermittently charge the doped well at regular intervals.

20. A protection circuit connected to a doped well in a semiconductor substrate of a semiconductor component, the protection circuit comprising:

a charging means for connecting the doped well intermittently to a provided electrical potential at regular intervals, and for maintaining the doped well at a floating potential between intermittent connections; and a detection means for detecting, between intermittent connections, a deviation of the potential present at the doped well from the provided potential, and for triggering an alarm signal in the event of a deviation below a predetermined value, thereby indicating a light attack.

* * * * *